(12) United States Patent
Otomura et al.

(10) Patent No.: US 12,418,272 B2
(45) Date of Patent: Sep. 16, 2025

(54) QUARTZ CRYSTAL RESONATOR UNIT, ELECTRONIC COMPONENT, AND ELECTRONIC DEVICE

(71) Applicant: Murata Manufacturing Co., Ltd., Nagaokakyo (JP)

(72) Inventors: Haruhide Otomura, Nagaokakyo (JP); Masahiro Saito, Nagaokakyo (JP); Muneyuki Daidai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 913 days.

(21) Appl. No.: 17/578,829

(22) Filed: Jan. 19, 2022

(65) Prior Publication Data
US 2022/0140815 A1    May 5, 2022

Related U.S. Application Data

(63) Continuation of application No. PCT/JP2020/023184, filed on Jun. 12, 2020.

(30) Foreign Application Priority Data

Jul. 29, 2019    (JP) .................. 2019-138921

(51) Int. Cl.
*H03H 9/215* (2006.01)
*H03H 9/17* (2006.01)

(52) U.S. Cl.
CPC ............ *H03H 9/215* (2013.01); *H03H 9/172* (2013.01)

(58) Field of Classification Search
CPC ........ H03H 9/19; H03H 9/1021; H03H 9/215; H03H 9/172
See application file for complete search history.

(56) References Cited

U.S. PATENT DOCUMENTS 5,258,139 A * 11/1993 Ichimura ................ C08G 59/12
525/487
5,714,238 A    2/1998 Komagata et al.
(Continued)

FOREIGN PATENT DOCUMENTS

CN    107534431 A    1/2018
CN    108368326 A    8/2018
(Continued)

OTHER PUBLICATIONS

International Search Report issued for PCT/JP2020/023184, date of mailing Aug. 11, 2020.
(Continued)

*Primary Examiner* — J. San Martin
(74) *Attorney, Agent, or Firm* — ArentFox Schiff LLP

(57) ABSTRACT

A quartz crystal resonator unit that includes: a quartz crystal resonator including an excitation electrode and a connection electrode electrically connected to the excitation electrode; a base member including an electrode pad; an electrically conductive holding member that connects the connection electrode and the electrode pad to each other; and a lid member attached to the base member so as to form an internal space between the lid member and the base member in which the quartz crystal resonator is accommodated. The electrically conductive holding member is a cured product of an electrically conductive adhesive containing (1) a silicone resin as a main component and (2) an epoxy compound having two or more epoxy groups.

20 Claims, 16 Drawing Sheets

(56) References Cited

U.S. PATENT DOCUMENTS

| | | | | |
|---|---|---|---|---|
| 2010/0066213 A1* | 3/2010 | Takahashi | ............... | H03H 3/02 |
| | | | | 29/25.35 |
| 2013/0207735 A1* | 8/2013 | Yoshida | ............... | H03H 9/1021 |
| | | | | 331/158 |
| 2015/0255633 A1* | 9/2015 | Sukata | ................... | C09J 163/00 |
| | | | | 252/514 |
| 2021/0040357 A1* | 2/2021 | Kondo | ................... | C09J 163/00 |

FOREIGN PATENT DOCUMENTS

| | | |
|---|---|---|
| JP | S59172571 A | 9/1984 |
| JP | H02180975 A | 7/1990 |
| JP | H09157613 A | 6/1997 |
| JP | H09328671 A | 12/1997 |
| JP | H11236545 A | 8/1999 |
| WO | 2009022574 A1 | 2/2009 |
| WO | 2018212184 A1 | 11/2018 |

OTHER PUBLICATIONS

Written Opinion of the International Search Report issued for PCT/JP2020/023184, date of mailing Aug. 11, 2020.

* cited by examiner 0.1 wt%

0.5 wt%

1 wt%

5 wt%

10 wt%

QUARTZ CRYSTAL RESONATOR UNIT, ELECTRONIC COMPONENT, AND ELECTRONIC DEVICE

CROSS REFERENCE TO RELATED APPLICATIONS

The present application is a continuation of International application No. PCT/JP2020/023184, filed Jun. 12, 2020, which claims priority to Japanese Patent Application No. 2019-138921, filed Jul. 29, 2019, the entire contents of each of which are incorporated herein by reference.

FIELD OF THE INVENTION

The present invention relates to a quartz crystal resonator unit, an electronic component, and an electronic device.

BACKGROUND OF THE INVENTION

Piezoelectric resonator units are being used as timing devices, sensors, oscillators, etc. in various electronic devices such as mobile communication terminals, communication base stations, and home appliances. For example, a piezoelectric resonator unit includes a piezoelectric resonator that has a mechanical vibration portion that converts electric vibration into mechanical vibration by using a piezoelectric effect, a holder that accommodates the piezoelectric resonator, and an electrically conductive holding member that connects the piezoelectric resonator and the holder to each other. The electrically conductive holding member is, for example, a cured product of an electrically conductive adhesive containing an epoxy resin as a main component.

Patent Document 1 discloses an electrically conductive adhesive that contains an epoxy resin including 5 to 60 wt % of glycidyl siloxane, a curing agent, and an electrically conductive material.

Patent Document 2 discloses an electrically conductive adhesive including an epoxy resin in which a glycidyl reactive diluent accounts for 20 to 70 wt %, a phenol resin curing agent in which an alkyl resol phenol resin and/or an alkyl novolac phenol resin accounts for 50 wt % or more, and electrically conductive particles.

Patent Document 3 discloses a quartz crystal resonator unit in which a metal electrode provided on a quartz crystal element and one end of an extended conductor of an envelope are bonded and fixed to each other with an electrically conductive adhesive containing, as essential components, an organic resin having two or more carboxyl groups in its molecular side chain or molecule end, an epoxy compound having an alicyclic epoxy and a glycidyl group in one molecule, and electrically conductive powder.

Patent Document 1: Japanese Unexamined Patent Application Publication No. 59-172571
Patent Document 2: Japanese Unexamined Patent Application Publication No. 9-157613
Patent Document 3: Japanese Unexamined Patent Application Publication No. 2-180975

SUMMARY OF THE INVENTION

In recent years, studies have been made to improve frequency-temperature characteristics by using, as an electrically conductive holding member that connects a quartz crystal resonator and a holder to each other, a cured product of a silicone-based electrically conductive adhesive containing a silicone resin as a main component. However, when a cured product of a resin-based adhesive is used as a joining member that connects a base member and a lid member, the use of a cured product of a silicone-based electrically conductive adhesive as an electrically conductive holding member has caused a problem of deterioration of resistance in a high-humidity environment.

The present invention has been made in view of these circumstances, and an object thereof is to provide a quartz crystal resonator unit with improved reliability, an electronic component, and an electronic device.

A quartz crystal resonator unit according to one aspect of the present invention includes: a quartz crystal resonator including an excitation electrode and a connection electrode electrically connected to the excitation electrode; a base member including an electrode pad; an electrically conductive holding member that connects the connection electrode and the electrode pad to each other; and a lid member attached to the base member so as to form an internal space between the lid member and the base member in which the quartz crystal resonator is accommodated. The electrically conductive holding member is a cured product of an electrically conductive adhesive containing (1) a silicone resin as a main component and (2) an epoxy compound having two or more epoxy groups.

An electronic device according to one aspect of the present invention includes an electronic component, a substrate including a metal layer, and an electrically conductive adhesive portion that connects the electronic component and the metal layer of the substrate to each other. The electrically conductive adhesive portion is a cured product of an electrically conductive adhesive containing (1) a silicone resin as a main component and (2) an epoxy compound having two or more epoxy groups.

An electronic component according to one aspect of the present invention includes a first adherend portion having electrical conductivity, a second adherend portion having electrical conductivity, and an electrically conductive adhesive portion that connects the first adherend portion and the second adherend portion to each other. The electrically conductive adhesive portion is a cured product of an electrically conductive adhesive containing (1) a silicone resin as a main component and (2) an epoxy compound having two or more epoxy groups.

According to the present invention, a quartz crystal resonator unit with improved reliability, an electronic component, and an electronic device can be provided.

DETAILED DESCRIPTION OF THE PREFERRED EMBODIMENTS

Hereinafter, embodiments of the present invention will be described with reference to the drawings. The drawings of the embodiments are given by way of illustration. The dimensions and shapes of elements are schematic, and the embodiments should not be construed to limit the technical scope of the present invention.

First Embodiment

Figure 1:
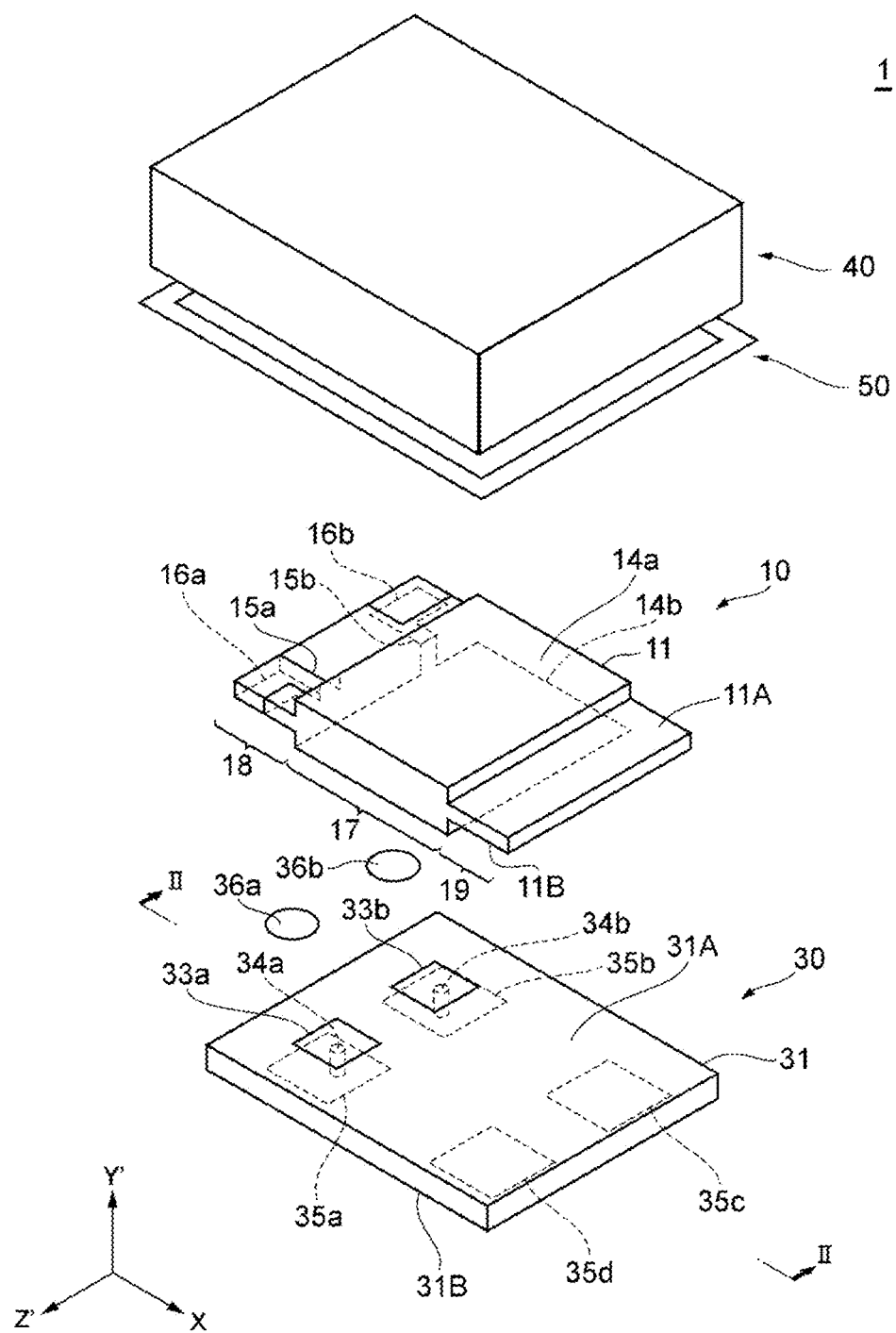
FIG. 1 is an exploded perspective view schematically illustrating the configuration of a quartz crystal resonator unit according to a first embodiment.
Figure 2:
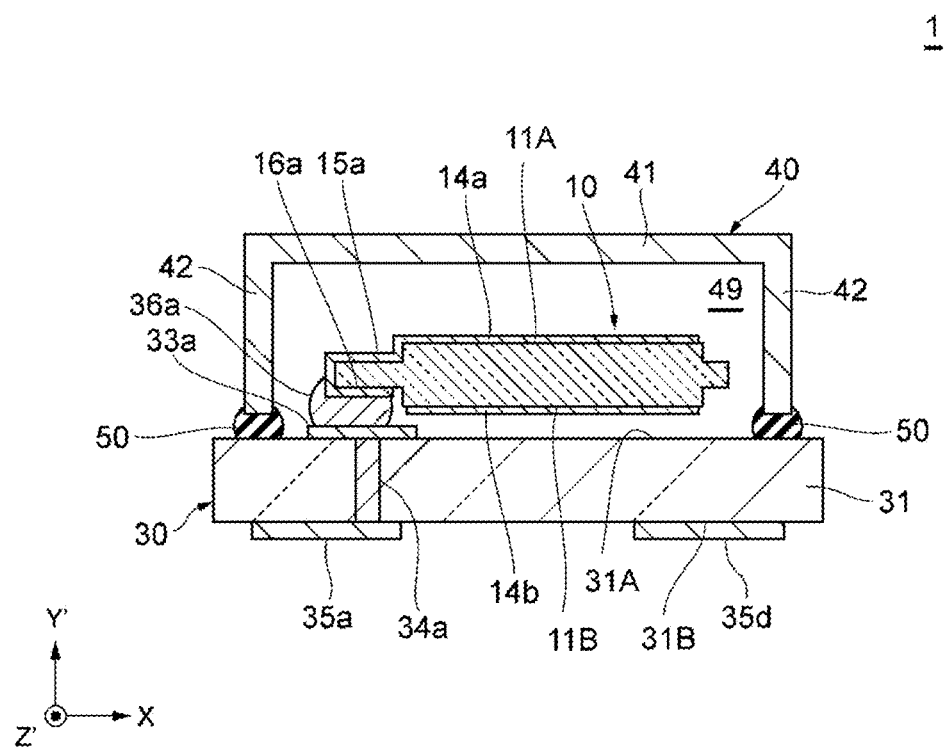
FIG. 2 is a sectional view schematically illustrating the configuration of the quartz crystal resonator unit according to the first embodiment.
Figure 3:
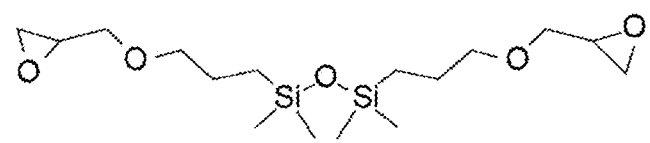
FIG. 3 shows a structural formula of an epoxy compound added to an electrically conductive adhesive.

The configuration of a quartz crystal resonator unit 1 according to a first embodiment of the present invention will be described with reference to FIG. 1 to FIG. 3. FIG. 1 is an exploded perspective view schematically illustrating the configuration of the quartz crystal resonator unit according to the first embodiment. FIG. 2 is a sectional view schematically illustrating the configuration of the quartz crystal resonator unit according to the first embodiment. FIG. 3 shows a structural formula of an epoxy compound added to an electrically conductive adhesive. The sectional view illustrated in FIG. 2 shows a section of the quartz crystal resonator unit 1 taken along line II-II of FIG. 1.

In each figure, an orthogonal coordinate system with an X-axis, a Y'-axis, and a Z'-axis may be provided for convenience in order to clarify the relationship between the figures and help understand the positional relationship of members. The X-axis, the Y'-axis, and the Z'-axis in one figure respectively correspond to the X-axis, the Y'-axis, and the Z'-axis in the other figure. The X-axis, the Y'-axis, and the Z'-axis correspond to the crystallographic axes of a quartz crystal element 11, which will be described later. The X-axis corresponds to the electrical axis (polar axis), a Y-axis to the mechanical axis, and a Z-axis to the optical axis. The Y'-axis and the Z'-axis are axes obtained by rotating the Y-axis and the Z-axis, respectively, about the X-axis by 35 degree 15 minutes±1 minute 30 seconds in a direction from the Y-axis toward the Z-axis.

In the following description, a direction parallel to the X-axis is referred to as an "X-axis direction", a direction parallel to the Y'-axis as a "Y'-axis direction", and a direction parallel to the Z'-axis as a "Z'-axis direction". Directions of arrows of the X-axis, the Y'-axis, and the Z'-axis are referred to as "+(plus)", and directions opposite to the arrows as "− (minus)". Although the description will be made with the +Y'-axis direction being an upward direction and the −Y'-axis direction being a downward direction for convenience, the vertical orientation of the quartz crystal resonator unit 1 is not limited. For example, in the following description, the +Y' side and the −Y' side of a quartz crystal resonator 10 are respectively referred to as an upper surface 11A and a lower surface 11B, but the quartz crystal resonator unit 1 may be disposed such that the upper surface 11A is located vertically below the lower surface 11B.

The quartz crystal resonator unit 1 includes a quartz crystal resonator 10, a base member 30, a lid member 40, and a joining member 50. The quartz crystal resonator 10 is provided between the base member 30 and the lid member 40. The base member 30 and the lid member 40 constitute a holder for accommodating the quartz crystal resonator 10. In the example illustrated in FIG. 1 and FIG. 2, the base member 30 is shaped like a flat plate, and the lid member 40 defines a bottomed hollow space for accommodating the quartz crystal resonator 10 on the base member 30 side. The quartz crystal resonator 10 is mounted on the base member 30. The base member 30 and the lid member 40 may have any other shapes as long as at least a portion of the quartz crystal resonator 10 that is to be excited is accommodated in the holder. In addition, the quartz crystal resonator 10 may be held in any other manner. For example, the base member 30 may define a bottomed hollow space for accommodating the quartz crystal resonator 10 on the lid member 40 side. The base member 30 and the lid member 40 may sandwich a peripheral portion of a portion of the quartz crystal resonator 10 that is to be excited.

First, the quartz crystal resonator 10 will be described.

The quartz crystal resonator 10 is a device that converts electrical energy and mechanical energy into each other by vibrating quartz crystal using a piezoelectric effect. The quartz crystal resonator 10 includes a quartz crystal element 11 having a shape of a thin chip, a first excitation electrode 14*a* and a second excitation electrode 14*b* that constitute a pair of excitation electrodes, a first extended electrode 15*a* and a second extended electrode 15*b* that constitute a pair of extended electrodes, and a first connection electrode 16*a* and a second connection electrode 16*b* that constitute a pair of connection electrodes.

The quartz crystal element 11 has an upper surface 11A and a lower surface 11B facing away from each other. The upper surface 11A is located on the side opposite the base member 30, that is, the side facing a ceiling portion 41 of the lid member 40, which will be described later. The lower surface 11B is located on the side facing the base member 30.

The quartz crystal element 11 is, for example, an AT-cut quartz crystal element. The AT-cut quartz crystal element 11 is formed such that in an orthogonal coordinate system with an X-axis, a Y'-axis, and a Z'-axis intersecting one another, a plane parallel to a plane defined by the X-axis and the Z'-axis (hereinafter referred to as an "XZ' plane", the same applies to planes defined by other axes) is a principal plane, and a direction parallel to the Y'-axis is a thickness direction. For example, the AT-cut quartz crystal element 11 is formed by etching a quartz crystal substrate (e.g., a quartz crystal wafer) obtained by cutting and polishing a crystalline body of synthetic quartz crystal.

The quartz crystal resonator 10 including the AT-cut quartz crystal element 11 has high frequency stability in a wide temperature range. In the AT-cut quartz crystal resonator 10, a thickness shear vibration mode is used as a principal vibration. The rotation angles of the Y'-axis and the Z'-axis in the AT-cut quartz crystal element 11 may be inclined at an angle within the range from 35 degrees 15 minutes minus 5 degrees to 35 degrees 15 minutes plus 15 degrees. For the cut-angles of the quartz crystal element 11, a cut different from the AT cut may be used. For example, BT cut, GT cut, SC cut, or other cuts may be used. The quartz crystal resonator may be a tuning fork quartz crystal resonator including a quartz crystal element having cut-angles of an element called a Z plate.

The AT-cut quartz crystal element 11 has a plate shape with a long-side direction in which long sides parallel to the X-axis direction extend, a short-side direction in which short sides parallel to the Z'-axis direction extend, and a thickness direction in which a thickness parallel to the Y'-axis direction extends. The quartz crystal element 11 has a rectangular shape when the upper surface 11A is viewed in plan, and has an excitation portion 17 that is centrally located and contributes to excitation and peripheral portions 18 and 19 adjacent to the excitation portion 17. The excitation portion 17 and the peripheral portions 18 and 19 are each formed in a band shape across the width of the quartz crystal element 11 along the Z'-axis direction. The peripheral portion 18 is located on the −X side of the excitation portion 17, and the peripheral portion 19 is located on the +X side of the excitation portion 17.

The planar shape of the quartz crystal element 11 when the upper surface 11A is viewed in plan is not limited to a rectangular shape. The planar shape of the quartz crystal element 11 may be a polygonal shape, a circular shape, an elliptical shape, or a combination thereof. The planar shape of the quartz crystal element 11 may be a tuning fork shape having a base portion and vibrating arm portions extending in parallel from the base portion. The quartz crystal element 11 may be provided with a slit for the purpose of suppressing vibration leakage and stress propagation. The shapes of the excitation portion 17 and the peripheral portions 18 and 19 of the quartz crystal element 11 are also not limited to the band shape across the width. For example, the planar shape of the excitation portion may be an island shape that is adjacent to peripheral portions also in the Z'-axis direction, and the planar shape of the peripheral portions may be shaped like a frame surrounding the excitation portion.

The quartz crystal element 11 has a so-called mesa structure in which the thickness of the excitation portion 17 is larger than the thicknesses of the peripheral portions 18 and 19. The quartz crystal element 11 having a mesa structure can suppress vibration leakage from the excitation portion 17. The quartz crystal element 11 has a double-sided mesa structure. The excitation portion 17 protrudes beyond the peripheral portions 18 and 19 on both the upper surface 11A side and the lower surface 11B side. The boundary between the excitation portion 17 and the peripheral portion 18 and the boundary between the excitation portion 17 and the peripheral portion 19 have a tapered shape in which the thickness continuously changes, but may have a stepped shape in which the change in thickness is discontinuous. The boundaries may have a convex shape in which the amount of change in thickness continuously changes or a bevel shape in which the amount of change in thickness discontinuously changes. The quartz crystal element 11 may have a single-sided mesa structure in which the excitation portion 17 protrudes beyond the peripheral portions 18 and 19 on either the upper surface 11A side or the lower surface 11B side. The quartz crystal element 11 may have a so-called inverted mesa structure in which the thickness of the excitation portion 17 is smaller than the thicknesses of the peripheral portions 18 and 19.

The first excitation electrode 14a and the second excitation electrode 14b are provided on the excitation portion 17. The first excitation electrode 14a is provided on the upper surface 11A side of the quartz crystal element 11, and the second excitation electrode 14b is provided on the lower surface 11B side of the quartz crystal element 11. In other words, the first excitation electrode 14a is provided on the main surface on the lid member 40 side of the quartz crystal element 11, and the second excitation electrode 14b is provided on the main surface on the base member 30 side of the quartz crystal element 11. The first excitation electrode 14a and the second excitation electrode 14b face away from each other with the quartz crystal element 11 interposed therebetween. When the upper surface 11A of the quartz crystal element 11 is viewed in plan, the first excitation electrode 14a and the second excitation electrode 14b each have a rectangular shape and are disposed so as to substantially entirely overlap each other. The first excitation electrode 14a and the second excitation electrode 14b are each formed in a band shape across the width of the quartz crystal element 11 along the Z'-axis direction.

The planar shape of the first excitation electrode 14a and the second excitation electrode 14b when the upper surface 11A of the quartz crystal element 11 is viewed in plan is not limited to a rectangular shape. The planar shape of the first excitation electrode 14a and the second excitation electrode 14b may be a polygonal shape, a circular shape, an elliptical shape, or a combination thereof.

The first extended electrode 15a and the second extended electrode 15b are provided on the peripheral portion 18. The first extended electrode 15a is provided on the upper surface 11A side of the quartz crystal element 11, and the second extended electrode 15b is provided on the lower surface 11B side of the quartz crystal element 11. The first extended electrode 15a electrically connects the first excitation electrode 14a and the first connection electrode 16a to each other. The second extended electrode 15b electrically connects the second excitation electrode 14b and the second connection electrode 16b to each other. For example, as illustrated in FIG. 1, one end of the first extended electrode 15a is connected at the excitation portion 17 to the first excitation electrode 14a, and the other end is connected at the peripheral portion 18 to the first connection electrode 16a via a side electrode provided on a side surface connecting the upper surface 11A and the lower surface 11B of the quartz crystal element 11 to each other. One end of the second extended electrode 15b is connected at the excitation portion 17 to the second excitation electrode 14b, and the other end is connected at the peripheral portion 18 to the second connection electrode 16b via the side electrode. To reduce stray capacitance, the first extended electrode 15a and the second extended electrode 15b are desirably separated from each other when the upper surface 11A of the quartz crystal element 11 is viewed in plan. For example, the first extended electrode 15a is provided in the +Z'-axis direction when viewed from the second extended electrode 15b.

The first connection electrode 16a and the second connection electrode 16b are each an electrode for electrically connecting the first excitation electrode 14a and the second excitation electrode 14b to the base member 30, and are provided on the lower surface 11B side of the quartz crystal element 11 at the peripheral portion 18. The first connection electrode 16a is provided at a corner portion formed of an end portion on the −X side and an end portion on the +Z' side of the quartz crystal element 11, and the second connection electrode 16b is provided at a corner portion formed of the end portion on the −X side and an end portion on the −Z' side of the quartz crystal element 11.

The first excitation electrode 14a, the first extended electrode 15a, and the first connection electrode 16a are integrally formed, and the second excitation electrode 14b, the second extended electrode 15b, and the second connection electrode 16b are integrally formed. The electrodes (the first excitation electrode 14a and the second excitation electrode 14b, the first extended electrode 15a and the second extended electrode 15b, and the first connection electrode 16a and the second connection electrode 16b) of the quartz crystal resonator 10 are each provided by, for example, laminating chromium (Cr) and gold (Au) in this order. Chromium is superior to gold in adhesion to the quartz crystal element 11, and gold is superior to chromium in chemical stability. Thus, when the innermost surface in contact with the quartz crystal element 11 contains chromium and the outermost surface exposed to an internal space 49 contains gold, damage due to peeling off of the electrodes of the quartz crystal resonator 10 and variation in electrical conductivity due to oxidation of the electrodes can be reduced, and the quartz crystal resonator 10 with high reliability can be provided. The outermost surface of the electrodes of the quartz crystal resonator 10 desirably consists substantially of gold. The outermost surface of the first connection electrode 16a corresponds to a contacting surface having an area in contact with a first electrically conductive holding member 36a, and the outermost surface of the second connection electrode 16b corresponds to a contacting surface having an area in contact with a second electrically conductive holding member 36b. On a side surface connecting the innermost surface and the outermost surface of each electrode of the quartz crystal resonator 10 to each other, a layer containing chromium and a layer containing gold are exposed.

Next, the base member 30 will be described.

The base member 30 holds the quartz crystal resonator 10 such that the quartz crystal resonator 10 can be excited. The base member 30 includes a substrate 31 having an upper surface 31A and a lower surface 31B facing away from each other. The upper surface 31A is located on the quartz crystal resonator 10 and the lid member 40 side and corresponds to a mounted surface on which the quartz crystal resonator 10 is mounted. The lower surface 31B corresponds to a mounting surface to be joined to, for example, an external circuit board (not illustrated). The substrate 31 is, for example, a sintered material such as insulating ceramic (alumina). To suppress the generation of thermal stress, the substrate 31 is preferably made of a heat-resistant material. To reduce stress on the quartz crystal resonator 10 due to thermal hysteresis, the substrate 31 may be made of a material having a coefficient of thermal expansion close to that of the quartz crystal element 11, such as quartz crystal.

The base member 30 includes a first electrode pad 33a and a second electrode pad 33b that constitute a pair of electrode pads. The first electrode pad 33a and the second electrode pad 33b are provided on the upper surface 31A of the substrate 31. The first electrode pad 33a and the second electrode pad 33b are terminals for electrically connecting the quartz crystal resonator 10 to the base member 30. To suppress a decrease in reliability due to oxidation, the outermost surface of each of the first electrode pad 33a and the second electrode pad 33b desirably contains gold, more desirably consists substantially of gold. For example, the first electrode pad 33a and the second electrode pad 33b may each have a two-layer structure including an underlying layer that improves adhesion to the substrate 31 and a surface layer that contains gold to suppress oxidation. The outermost surface of the first electrode pad 33a corresponds to a contacting surface having an area in contact with the first electrically conductive holding member 36a, and the outermost surface of the second electrode pad 33b corresponds to a contacting surface having an area in contact with the second electrically conductive holding member 36b.

The base member 30 includes a first outer electrode 35a, a second outer electrode 35b, a third outer electrode 35c, and a fourth outer electrode 35d. The first outer electrode 35a to the fourth outer electrode 35d are provided on the lower surface 31B of the substrate 31. The first outer electrode 35a and the second outer electrode 35b are terminals for electrically connecting an external substrate (not illustrated) and the quartz crystal resonator unit 1 to each other. The third outer electrode 35c and the fourth outer electrode 35d, which are dummy electrodes to/from which an electrical signal or the like is not input/output, may be ground electrodes that ground the lid member 40 to improve the electromagnetic shielding function of the lid member 40. The third outer electrode 35c and the fourth outer electrode 35d may be omitted.

The first electrode pad 33a and the second electrode pad 33b are arranged side by side along the Z'-axis direction at an end portion in the −X-axis direction of the base member 30. The first outer electrode 35a and the second outer electrode 35b are arranged side by side along the Z'-axis direction at the end portion in the −X-axis direction of the base member 30. The third outer electrode 35c and the fourth outer electrode 35d are arranged side by side along the Z'-axis direction at an end portion in the +X-axis direction of the base member 30. The first electrode pad 33a is electrically connected to the first outer electrode 35a via a first through electrode 34a extending through the substrate 31 along the Y'-axis direction. The second electrode pad 33b is electrically connected to the second outer electrode 35b via a second through electrode 34b extending through the substrate 31 along the Y'-axis direction.

The first electrode pad 33a and the second electrode pad 33b may be electrically connected to the first outer electrode 35a and the second outer electrode 35b, respectively, via a side electrode provided on a side surface connecting the upper surface 31A and the lower surface 31B of the substrate 31 to each other. The first outer electrode 35a to the fourth outer electrode 35d may be castellated electrodes provided in a recessed manner in side surfaces of the substrate 31.

The base member 30 includes the first electrically conductive holding member 36a and the second electrically conductive holding member 36b that constitute a pair of electrically conductive holding members. The first electrically conductive holding member 36a and the second electrically conductive holding member 36b are for mounting the quartz crystal resonator 10 on the base member 30 and electrically connect the quartz crystal resonator 10 and the base member 30 to each other. The first electrically conductive holding member 36a is joined to the first electrode pad 33a and the first connection electrode 16a and electrically connects the first electrode pad 33a and the first connection electrode 16a to each other. The second electrically conductive holding member 36b is joined to the second electrode pad 33b and the second connection electrode 16b and electrically connects the second electrode pad 33b and the second connection electrode 16b to each other. The first electrically conductive holding member 36a and the second electrically conductive holding member 36b hold the quartz crystal resonator 10 with a space left between the base member 30 and the quartz crystal resonator 10 so that the excitation portion 17 can be excited.

The first electrically conductive holding member 36a and the second electrically conductive holding member 36b are each a cured product of an electrically conductive adhesive including a thermosetting resin, a photocurable resin, or the like, and the main component of the first electrically conductive holding member 36a and the second electrically conductive holding member 36b is a silicone resin. The first electrically conductive holding member 36a and the second electrically conductive holding member 36b include electrically conductive particles, and the electrically conductive particles may be, for example, metal particles including silver (Ag). The first electrically conductive holding member 36a bonds the first electrode pad 33a and the first connection electrode 16a to each other, and the second electrically conductive holding member 36b bonds the second electrode pad 33b and the second connection electrode 16b to each other. The moduli of elasticity of silicone resins are more stable than those of epoxy resins in a wide temperature range. When the main component of the first electrically conductive holding member 36a and the second electrically conductive holding member 36b is a silicone resin, the frequency-temperature characteristics of the quartz crystal resonator 10 are improved as compared to when the main component is an epoxy resin.

The electrically conductive adhesive contains an epoxy compound having two or more glycidyl groups. In the present embodiment, the epoxy compound contained in the electrically conductive adhesive is 1,3-bis(3-glycidoxypropyl)-1,1,3,3-tetramethyldisiloxane shown in FIG. 3. The content of 1,3-bis(3-glycidoxypropyl)-1,1,3,3-tetramethyldisiloxane in the electrically conductive adhesive is, for example, 1 wt %. This improves the moisture resistance of the first electrically conductive holding member 36a and the second electrically conductive holding member 36b. Here, the improvement in moisture resistance means suppression of an increase in the contact resistance between the cured product of the electrically conductive adhesive and the adherends in a high-humidity environment.

The epoxy compound contained in the electrically conductive adhesive is not limited to the above compound and may be any epoxy compound having two or more epoxy groups. However, to improve the moisture resistance, the epoxy compound having two or more glycidyl groups is desirable. The content of the epoxy compound in the electrically conductive adhesive is not limited to 1 wt %, but is desirably 0.1 wt % or more to improve the moisture resistance. The epoxy compound contained in the electrically conductive adhesive is desirably an organosilicon compound, more desirably an epoxy compound having a siloxane bond. For example, the epoxy compound may be an oligomer or a polymer having 1,3-bis(3-glycidoxypropyl)-1,1,3,3-tetramethyldisiloxane as a structural unit. The component weight ratio of the electrically conductive adhesive is, for example, 60 wt % of electrically conductive particles, 20 wt % of a silicone resin composition, and 20 wt % of a solvent. The epoxy compound having two or more glycidyl groups is included in the silicone resin composition, and the content of the epoxy compound is the ratio of the weight of the epoxy compound to the total weight of the electrically conductive adhesive. That is, when the electrically conductive adhesive is composed of electrically conductive particles, a silicone resin composition, and a solvent, the content of the epoxy compound is the ratio of the weight of the epoxy compound to the sum of the weights of the electrically conductive particles, the silicone resin composition, and the solvent.

The electrically conductive adhesive may contain additives in addition to silane or siloxane serving as a raw material for the silicone resin, the electrically conductive particles, and the epoxy compound having two or more epoxy groups. Examples of the additives include a tackifier, a filling agent, a thickener, a sensitizer, an antioxidant, and an antifoaming agent for the purpose of, for example, improving the workability and storage stability of the electrically conductive adhesive. In addition, a filler for the purpose of increasing the strength of the cured product or keeping the distance between the base member 30 and the quartz crystal resonator 10 may be added.

The step of providing the first electrically conductive holding member 36a and the second electrically conductive holding member 36b includes, for example, an application step of applying an electrically conductive adhesive whose viscosity has been adjusted to be paste-like onto the first electrode pad 33a and the second electrode pad 33b; a mounting step of mounting the quartz crystal resonator 10 on the electrically conductive adhesive to let the electrically conductive adhesive that has been spread out on the surfaces of the first connection electrode 16a and the second connection electrode 16b support the quartz crystal resonator 10; and a curing step of curing the electrically conductive adhesive. The step of providing the first electrically conductive holding member 36a and the second electrically conductive holding member 36b may include, before or after the mounting step, a temporary curing step of incompletely curing the electrically conductive adhesive. This can inhibit contact between the quartz crystal resonator 10 and the base member 30 due to collapse of the position of the quartz crystal resonator 10 before the curing step.

Next, the lid member 40 will be described.

The lid member 40 is joined to the base member 30 and forms, between the lid member 40 and the base member 30, the internal space 49 in which the quartz crystal resonator 10 is accommodated. The lid member 40 may be made of any material, for example, an electrically conductive material such as metal. When the lid member 40 is made of an electrically conductive material, the lid member 40 is provided with an electromagnetic shielding function of reducing the entry and exit of electromagnetic waves to and from the internal space 49.

The lid member 40 includes a ceiling portion 41 having a flat shape and a side wall portion 42 connected to the edge of the ceiling portion 41 and extending in a direction perpendicular to the main surface of the ceiling portion 41. The planar shape the ceiling portion 41 as viewed in plan from the direction normal to the main surface is, for example, a rectangular shape. The ceiling portion 41 faces the base member 30 with the quartz crystal resonator 10 interposed therebetween, and the side wall portion 42 surrounds the quartz crystal resonator 10 in a direction parallel to the XZ' plane. A tip portion of the side wall portion 42 extends in a frame-like shape such that the tip portion is closer to the base member 30 than the quartz crystal resonator 10 is.

The lid member 40 may be made of a ceramic material, a semiconductor material, a resin material, or the like. The planar shape the ceiling portion 41 may be a polygonal shape, a circular shape, an elliptical shape, or a combination thereof.

Next, the joining member 50 will be described.

The joining member 50 is provided over the entire peripheries of the base member 30 and the lid member 40 and has a rectangular frame shape. When the upper surface 31A of the base member 30 is viewed in plan, the first electrode pad 33a and the second electrode pad 33b are disposed inside the joining member 50, and the joining member 50 is provided so as to surround the quartz crystal resonator 10. The joining member 50 joins the tip portion of the side wall portion 42 of the lid member 40 and the upper surface 31A of the substrate 31 of the base member 30 to each other to seal the internal space 49. The joining member 50 desirably has high gas barrier properties, and more desirably has low moisture permeability. This joining member 50 is, for example, a cured product of an adhesive containing an epoxy resin as a main component. The resin-based adhesive constituting the joining member 50 may contain, for example, a vinyl compound, an acrylic compound, a urethane compound, or a silicone compound.

The joining member 50 need not necessarily have a circumferentially continuous frame shape and may be provided discontinuously in the circumferential direction. The joining member 50 may be formed of, for example, a cured product of a silicon-based adhesive containing water glass and the like, a cured product of a calcium-based adhesive containing cement and the like, or Au—Sn alloy-based metal solder. When the joining member 50 is formed of metal solder, the base member 30 may be provided with a metallized layer for the purpose of improving the adhesion between the base member 30 and the joining member 50. The joining member 50 may include a cured product of a resin-based adhesive and a coating that is less moisture-permeable than the cured product of a resin-based adhesive.

(Moisture Resistance Evaluation)

Figure 4:
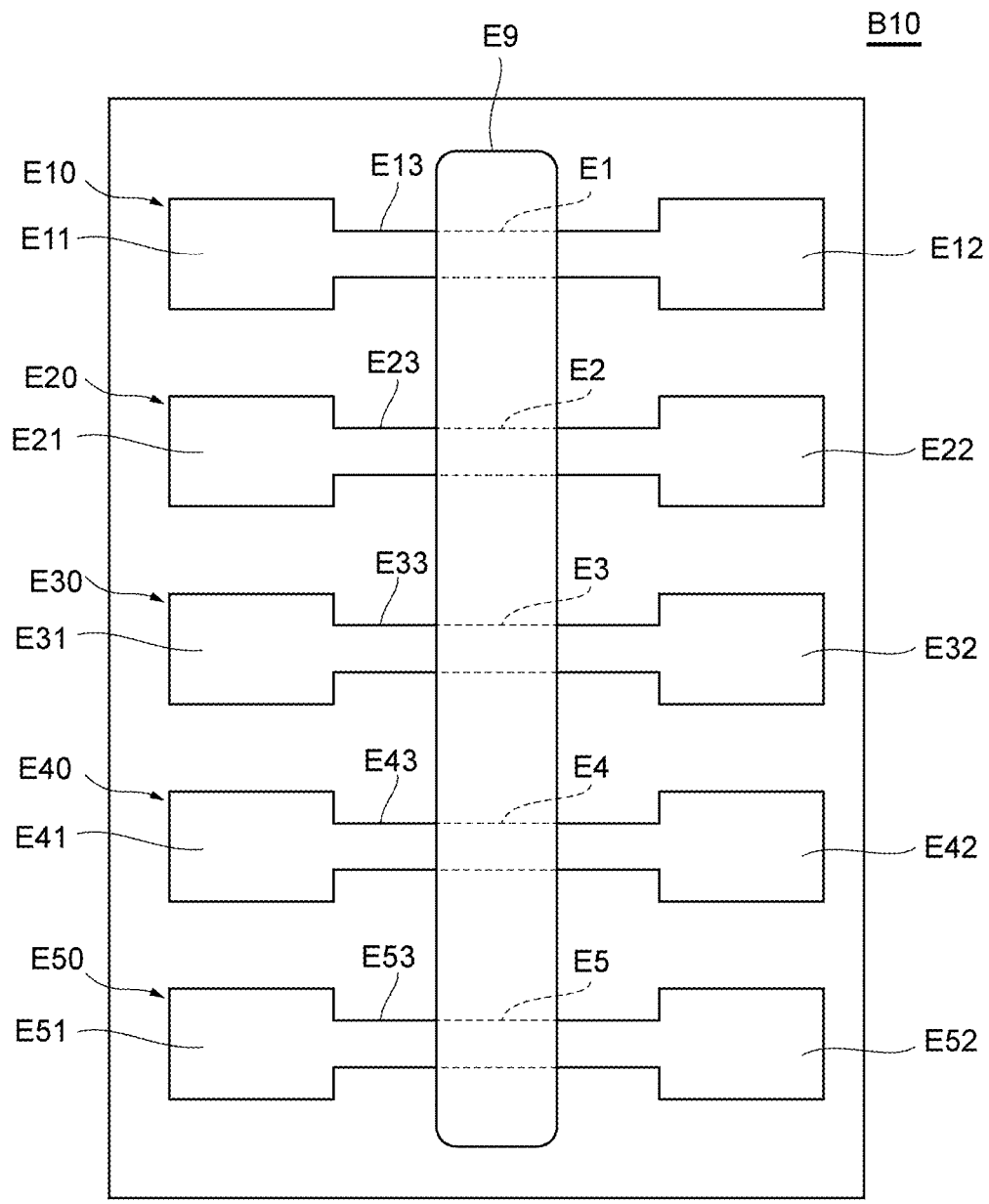
FIG. 4 is a plan view schematically illustrating the structure of an evaluation substrate used in a moisture resistance test.
Figure 5:
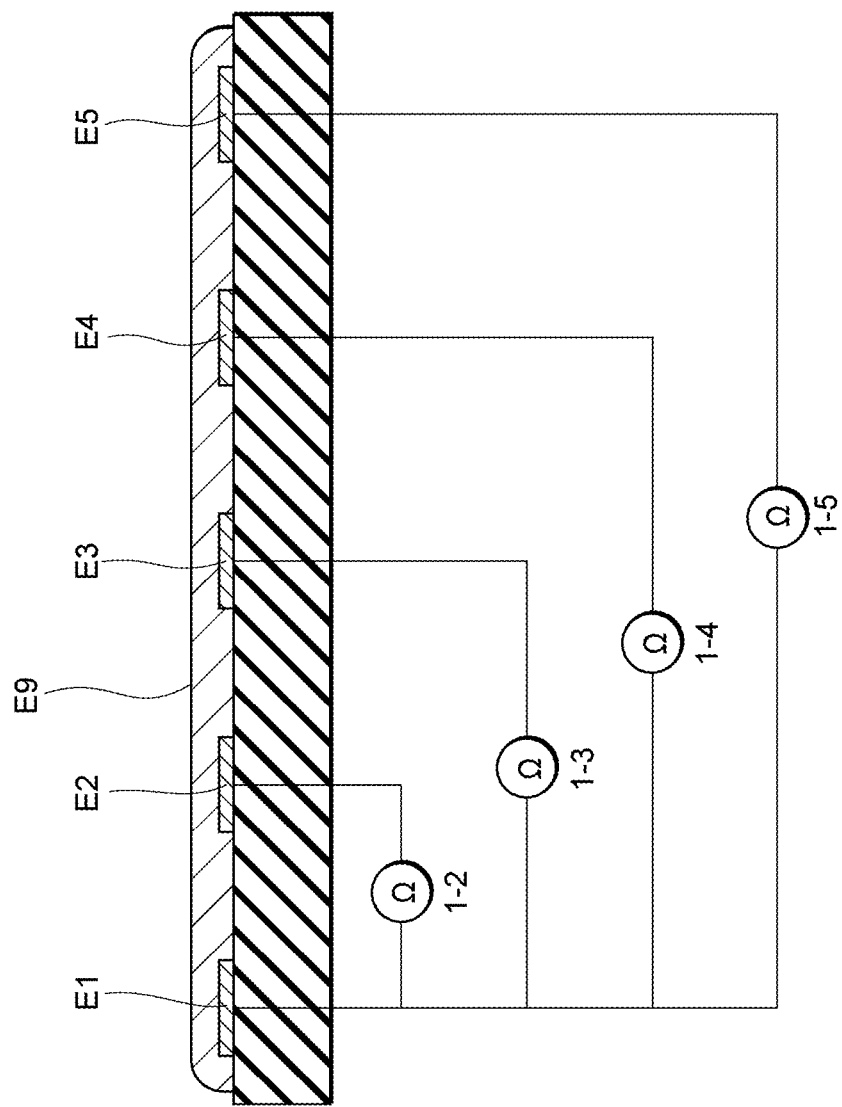
FIG. 5 is a sectional view schematically illustrating the structure of the evaluation substrate used in the moisture resistance test.
Figure 6:
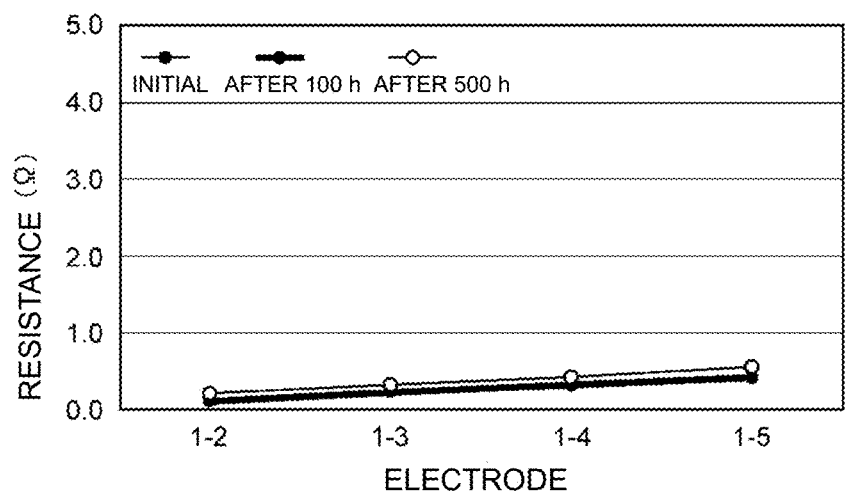
FIG. 6 is a graph schematically showing the evaluation results of an example.
Figure 7:
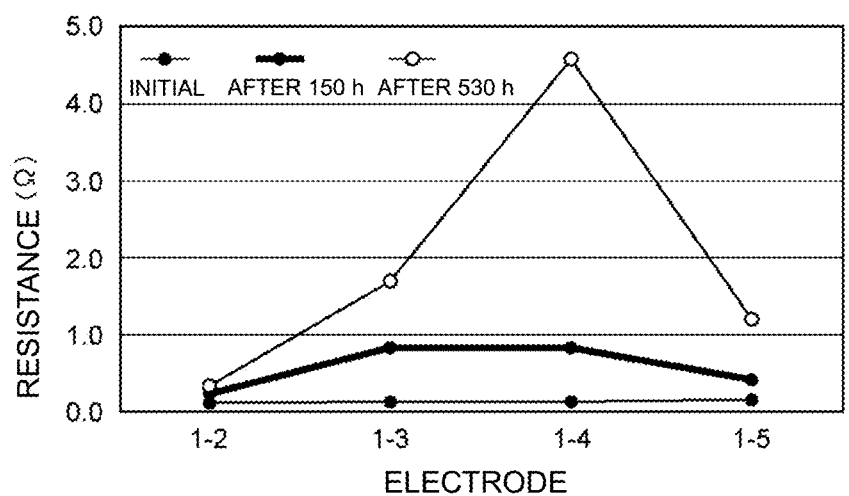
FIG. 7 is a graph schematically showing the evaluation results of a comparative example.

With reference to FIG. 4 to FIG. 7, a moisture resistance test to investigate the influence of humidity on the electrical conductivity between a metal electrode and a cured product of an electrically conductive adhesive will be described. FIG. 4 is a plan view schematically illustrating the structure of an evaluation substrate used in the moisture resistance test. FIG. 5 is a sectional view schematically illustrating the structure of the evaluation substrate used in the moisture resistance test. FIG. 6 is a graph schematically showing the evaluation results of an example. FIG. 7 is a graph schematically showing the evaluation results of a comparative example. In the graphs of FIG. 6 and FIG. 7, the horizontal axis represents the position of measured resistance, and the vertical axis represents resistance ($\Omega$).

As illustrated in FIG. 4, a first electrode pair E10, a second electrode pair E20, a third electrode pair E30, a fourth electrode pair E40, and a fifth electrode pair E50 are arranged in this order on an evaluation substrate B10. The first electrode pair E10 to the fifth electrode pair E50 are provided on an insulating substrate. The first electrode pair E10 includes a pair of measurement electrodes E11 and E12 and a bridge electrode E13 that connects the measurement electrode E11 and the measurement electrode E12 to each other. Likewise, the second electrode pair E20 includes a pair of measurement electrodes E21 and E22 and a bridge electrode E23, the third electrode pair E30 includes a pair of measurement electrodes E31 and E32 and a bridge electrode E33, the fourth electrode pair E40 includes a pair of measurement electrodes E41 and E42 and a bridge electrode E43, and the fifth electrode pair E50 includes a pair of measurement electrodes E51 and E52 and a bridge electrode E53. Central portions E1, E2, E3, E4, and E5 of the bridge electrodes E13 to E53 are covered by a cured electrically conductive adhesive E9. The cured electrically conductive adhesive E9 is substantially uniform in width and thickness and extends in a direction in which the first electrode pair E10 to the fifth electrode pair E50 are arranged. The first electrode pair E10 to the fifth electrode pair E50 are electrically connected together via the cured electrically conductive adhesive E9.

The insulating substrate is an alumina substrate. The first electrode pair E10 to the fifth electrode pair E50 are metal electrodes having a laminated structure including an underlying layer formed of nickel and a surface layer formed of gold. The outermost surfaces of the first electrode pair E10 to the fifth electrode pair E50 are formed of gold. The cured electrically conductive adhesive E9 contains a silicone resin as a main component. The electrically conductive adhesive of the example contains 1% of 1,3-bis(3-glycidoxypropyl)-1,1,3,3-tetramethyldisiloxane. The electrically conductive adhesive of the comparative example is the same as the electrically conductive adhesive of the example except that 1,3-bis(3-glycidoxypropyl)-1,1,3,3-tetramethyldisiloxane is not contained.

As illustrated in FIG. 5, changes of a resistance 1-2 between the central portion E1 and the central portion E2, a resistance 1-3 between the central portion E1 and the central portion E3, a resistance 1-4 between the central portion E1 and the central portion E4, and a resistance 1-5 between the central portion E1 and the central portion E5 were measured, whereby the moisture resistance of the cured electrically conductive adhesive E9 was evaluated. The resistance 1-2 is determined by the contact resistance between the central portion E1 and the cured electrically conductive adhesive E9, the resistance of the cured electrically conductive adhesive E9 between the central portion E1 and the central portion E2, and the contact resistance between the cured electrically conductive adhesive E9 and the central portion E2. Similarly, the resistance 1-3, the resistance 1-4, and the resistance 1-5 are each determined by the resistance of the cured electrically conductive adhesive E9 itself and the contact resistance between the cured electrically conductive adhesive E9 and the central portion of each electrode pair.

To offset the influence of factors other than the central portions E1 and E2 and the cured electrically conductive adhesive E9, the resistance 1-2 was measured as follows.

The resistance between the measurement electrode E11 and the measurement electrode E21, the resistance between the measurement electrode E11 and the measurement electrode E22, the resistance between the measurement electrode E12 and the measurement electrode E22, and the resistance between the measurement electrode E12 and the measurement electrode E21 were measured and summed up. This calculation result was taken as A.

The resistance between the measurement electrode E11 and the measurement electrode E12 and the resistance between the measurement electrode E21 and the measurement electrode E22 were measured, summed up, and doubled. This calculation result was taken as B.

B was subtracted from A, and the result was divided by 4 to calculate the resistance 1-2.

The resistance 1-3, the resistance 1-4, and the resistance 1-5 were calculated in the same manner.

As shown in FIG. 6, in the example, the measurement was performed in an initial state, a state after being left to stand for 100 hours in an environment of a temperature of 85° C. and a humidity of 85% RH (hereinafter referred to as "85° C. and 85% RH") in a constant temperature and humidity chamber, and a state after being left to stand for 500 hours in 85° C. and 85% RH. In FIG. 6, a line graph indicating the resistance in the initial state is represented as "INITIAL", a line graph indicating the resistance in the state after being left to stand for 100 hours as "AFTER 100 h", and a line graph indicating the resistance in the state after being left to stand for 500 hours as "AFTER 500 h".

Even in the state after being left to stand for 500 hours, the resistance 1-2, the resistance 1-3, the resistance 1-4, and the resistance 1-5 were all 1Ω or less, deterioration of the resistance from the initial state was hardly observed.

As shown in FIG. 7, in the comparative example, the measurement of resistance was performed in an initial state, a state after being left to stand for 150 hours in 85° C. and 85% RH, and a state after being left to stand for 530 hours in 85° C. and 85% RH. In FIG. 7, a line graph indicating the resistance in the initial state is represented as "INITIAL", a line graph indicating the resistance in the state after being left to stand for 150 hours as "AFTER 150 h", and a line graph indicating the resistance in the state after being left to stand for 530 hours as "AFTER 530 h".

In the state after being left to stand for 530 hours, the resistance 1-3, the resistance 1-4, and the resistance 1-5 were more than 1Ω, that is, deterioration from the initial state was observed. In particular, the resistance 1-4 was more than 4Ω in the state after being left to stand for 530 hours. Since the resistance 1-3 and the resistance 1-5 are higher than the resistance 1-4 in the state after being left to stand for 530 hours, the major factor of the increase in resistance is probably not an increase in the resistance of the cured electrically conductive adhesive itself but an increase in the contact resistance between the cured electrically conductive adhesive and the central portion of each electrode pair.

The evaluation results of the example and the comparative example have shown that the presence of 1,3-bis(3-glycidoxypropyl)-1,1,3,3-tetramethyldisiloxane in a resin composition of an electrically conductive adhesive can suppress an increase in the contact resistance between a metal electrode and a cured product of the electrically conductive adhesive containing a silicone resin as a main component in a high-humidity environment.

Figure 9:
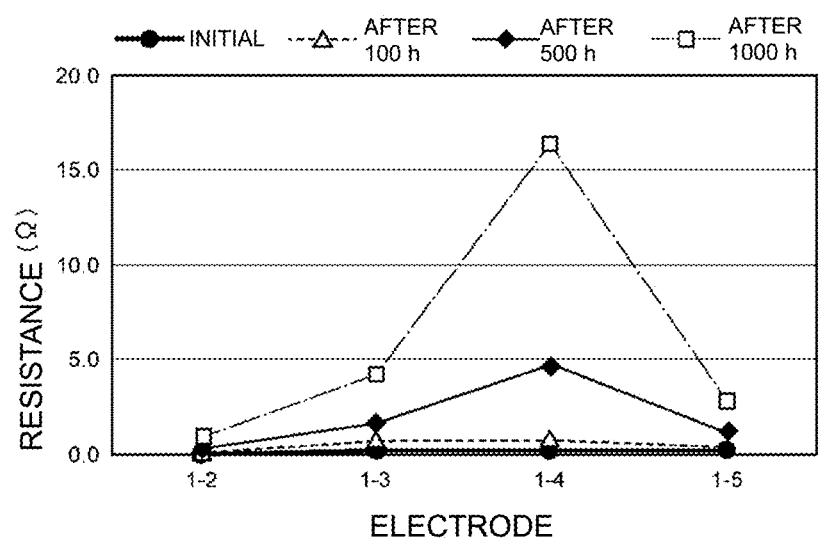
FIG. 9 is graph showing the results of an evaluation of moisture resistance in the case of an epoxy compound content of 0 wt %.
Figure 10:
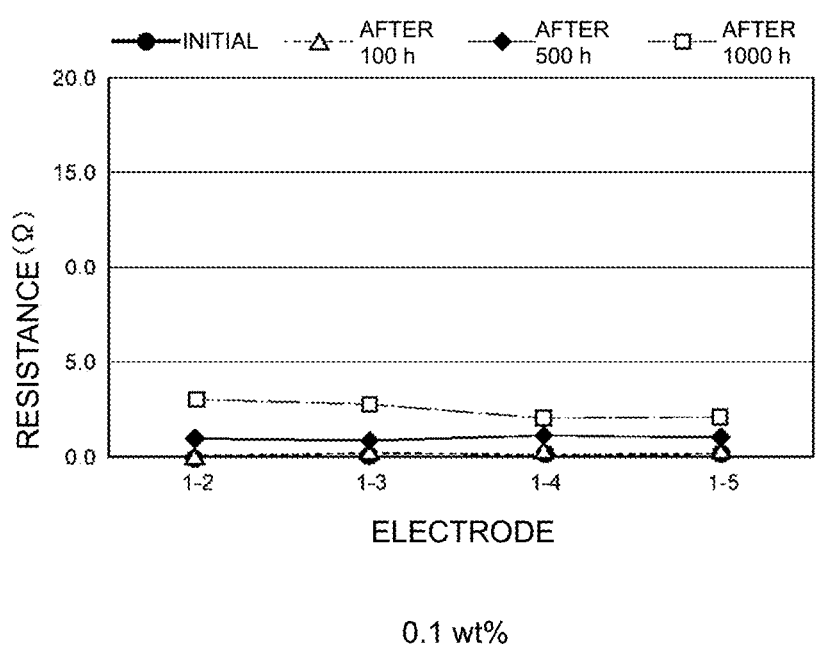
FIG. 10 is a graph showing the results of an evaluation of moisture resistance in the case of an epoxy compound content of 0.1 wt %.
Figure 11:
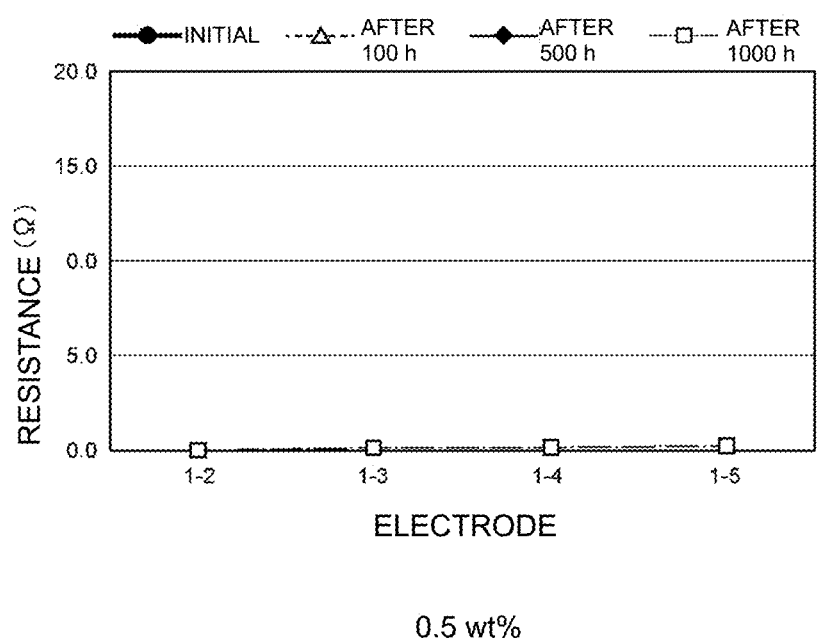
FIG. 11 is a graph showing the results of an evaluation of moisture resistance in the case of an epoxy compound content of 0.5 wt %.
Figure 12:
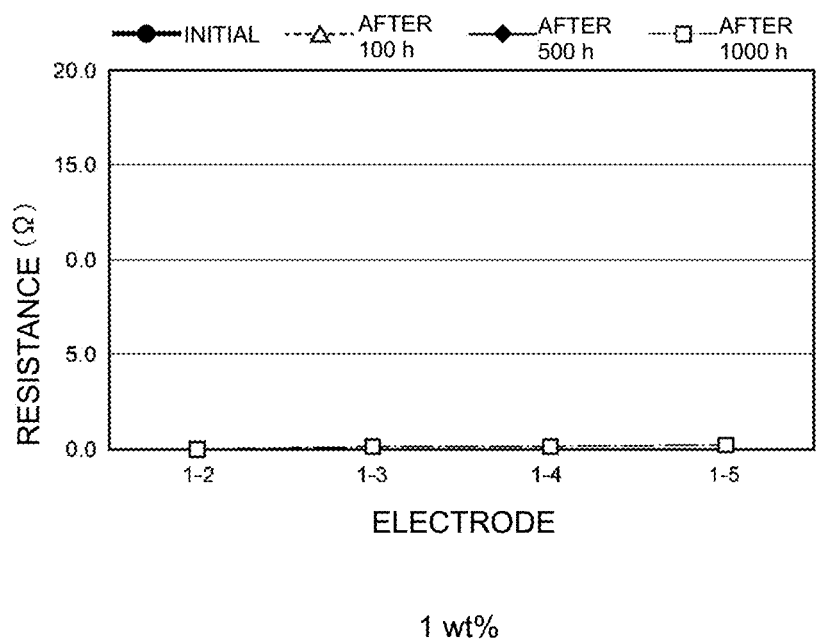
FIG. 12 is a graph showing the results of an evaluation of moisture resistance in the case of an epoxy compound content of 1 wt %.
Figure 13:
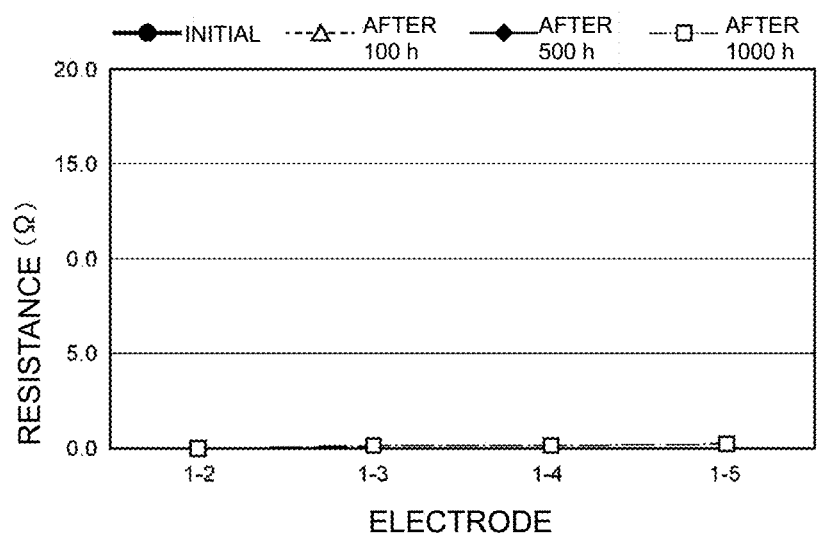
FIG. 13 is graph showing the results of an evaluation of moisture resistance in the case of an epoxy compound content of 5 wt %.
Figure 14:
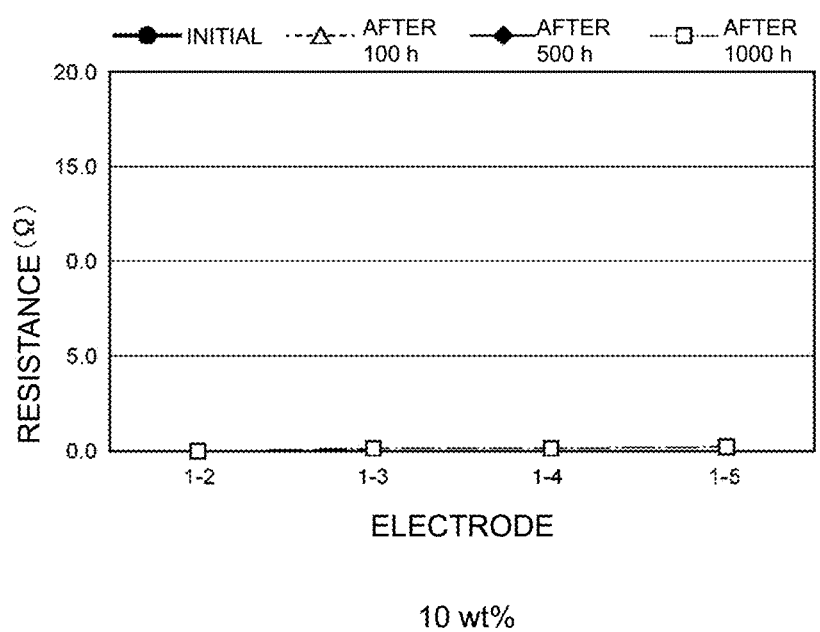
FIG. 14 is a graph showing the results of an evaluation of moisture resistance in the case of an epoxy compound content of 10 wt %.

Next, with reference to FIG. 9 to FIG. 14, the relationship between the content of 1,3-bis(3-glycidoxypropyl)-1,1,3,3-tetramethyldisiloxane and the moisture resistance of cured electrically conductive adhesives will be described. FIG. 9 is a graph showing the results of an evaluation of moisture resistance in the case of an epoxy compound content of 0 wt %. FIG. 10 is a graph showing the results of an evaluation of moisture resistance in the case of an epoxy compound content of 0.1 wt %. FIG. 11 is a graph showing the results of an evaluation of moisture resistance in the case of an epoxy compound content of 0.5 wt %. FIG. 12 is a graph showing the results of an evaluation of moisture resistance in the case of an epoxy compound content of 1 wt %. FIG. 13 is a graph showing the results of an evaluation of moisture resistance in the case of an epoxy compound content of 5 wt %. FIG. 14 is a graph showing the results of an evaluation of moisture resistance in the case of an epoxy compound content of 10 wt %.

In the moisture resistance test, changes in resistance in 85° C. and 85% RH were measured and compared in the same manner as the method of evaluation of the example and the comparative example shown in FIG. 4 to FIG. 7. In FIG. 9 to FIG. 14, "INITIAL" represents resistance in an initial state before being put into 85° C. and 85% RH, "AFTER 100 h" represents resistance at 100 hours after being put into 85° C. and 85% RH, "AFTER 500 h" represents resistance at 500 hours after being put into 85° C. and 85% RH, and "AFTER 1000 h" represents resistance at 1000 hours after being put into 85° C. and 85% RH. FIG. 9 corresponds to the evaluation results of the comparative example, and FIG. 12 corresponds to the evaluation results of the example. Regardless of the content of 1,3-bis(3-glycidoxypropyl)-1,1,3,3-tetramethyldisiloxane, the resistance in the initial state was substantially 0Ω. Therefore, the values of resistance at 100, 500, and 1000 hours each correspond to the amount of resistance change from the initial state. Larger amounts of resistance change indicate lower moisture resistance.

When the content of 1,3-bis(3-glycidoxypropyl)-1,1,3,3-tetramethyldisiloxane was 0 wt %, or when the epoxy compound was not contained, the resistance had already increased at 100 hours, had increased to about 5.0Ω at maximum at 500 hours, and had exceeded 15.0Ω at maximum at 1000 hours. When the content of 1,3-bis(3-glycidoxypropyl)-1,1,3,3-tetramethyldisiloxane was 0.1 wt %, the resistance showed almost no increase until at 100 hours, had started to increase at 500 hours, and had increased to about 4.0Ω at maximum at 1000 hours. When the content of 1,3-bis(3-glycidoxypropyl)-1,1,3,3-tetramethyldisiloxane was 0.5 to 10 wt %, the resistance showed almost no increase even at 1000 hours.

The above shows that the moisture resistance of a cured product of a silicone electrically conductive adhesive is improved by adding 0.1 wt % or more of an epoxy compound having two or more epoxy groups, and is further improved by adding 0.5 wt % or more of the epoxy compound. However, when the epoxy compound is added to the silicone electrically conductive adhesive, the viscosity decreases. In particular, when the content of the epoxy compound is more than 10 wt %, the decrease in viscosity may reduce workability, thus resulting in an increased rate of occurrence of defective quartz crystal resonator units. Therefore, to improve the moisture resistance while maintaining the workability, the content of the epoxy compound is desirably 0.1 wt % to 10 wt %, more desirably 0.5 wt % to 10 wt %. When the content of the epoxy compound is more than 10 wt %, the characteristics of the silicone resin may be lost from the cured product of the electrically conductive adhesive. For example, when the content of the epoxy compound is more than 10 wt %, the modulus of elasticity of the cured product of the electrically conductive adhesive may greatly vary with temperature changes, thus degrading the frequency-temperature characteristics of the quartz crystal resonator 10. Therefore, to inhibit the degradation of the frequency-temperature characteristics, the content of the epoxy compound is desirably 10 wt % or less.

Figure 15:
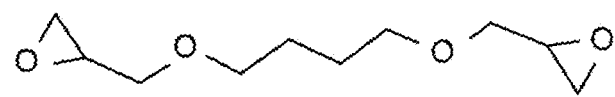
FIG. 15 shows a structural formula of an epoxy compound added in a first modified example.

Next, the moisture resistance of cured products of electrically conductive adhesives containing epoxy compounds other than 1,3-bis(3-glycidoxypropyl)-1,1,3,3-tetramethyldisiloxane will be described with reference to FIG. 15 to FIG.

Figure 16:
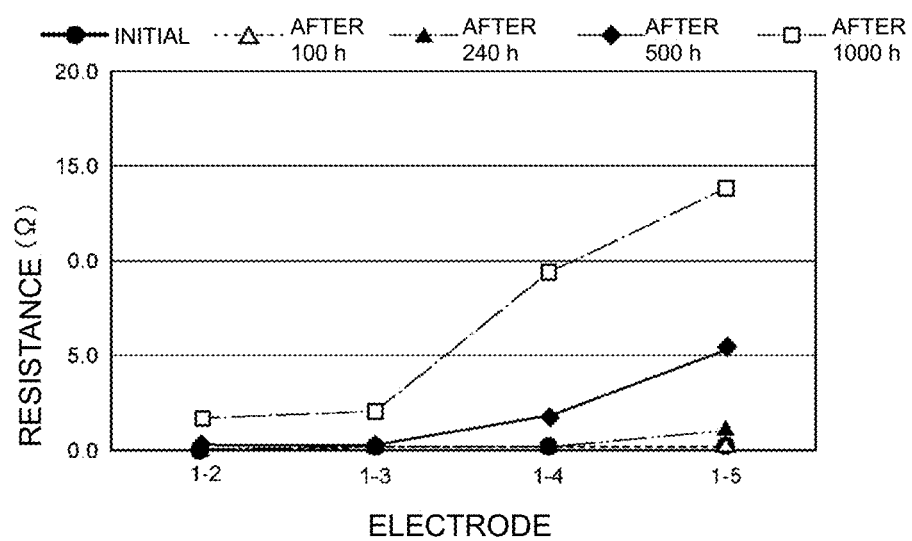
FIG. 16 is a graph showing the results of an evaluation of moisture resistance in the first modified example.
Figure 17:
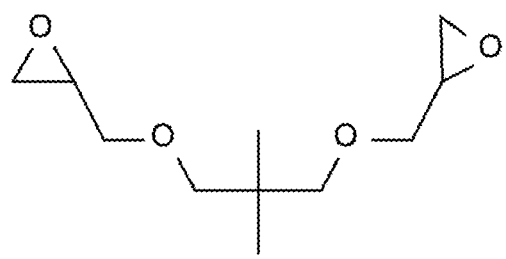
FIG. 17 shows a structural formula of an epoxy compound added in a second modified example.
Figure 18:
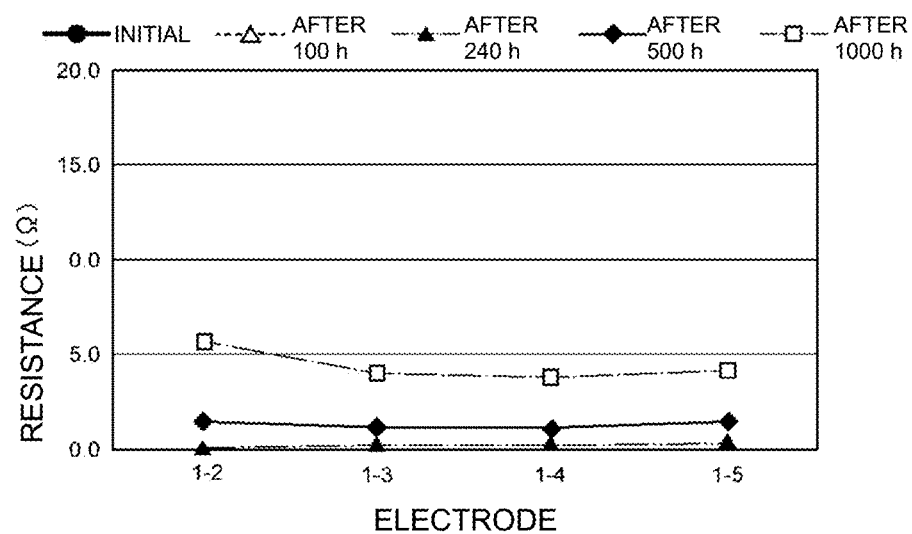
FIG. 18 is a graph showing the results of an evaluation of moisture resistance in the second modified example.
Figure 19:
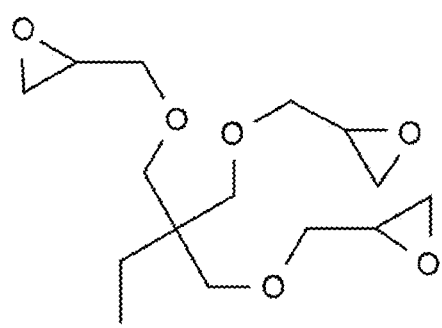
FIG. 19 shows a structural formula of an epoxy compound added in a third modified example.
Figure 20:
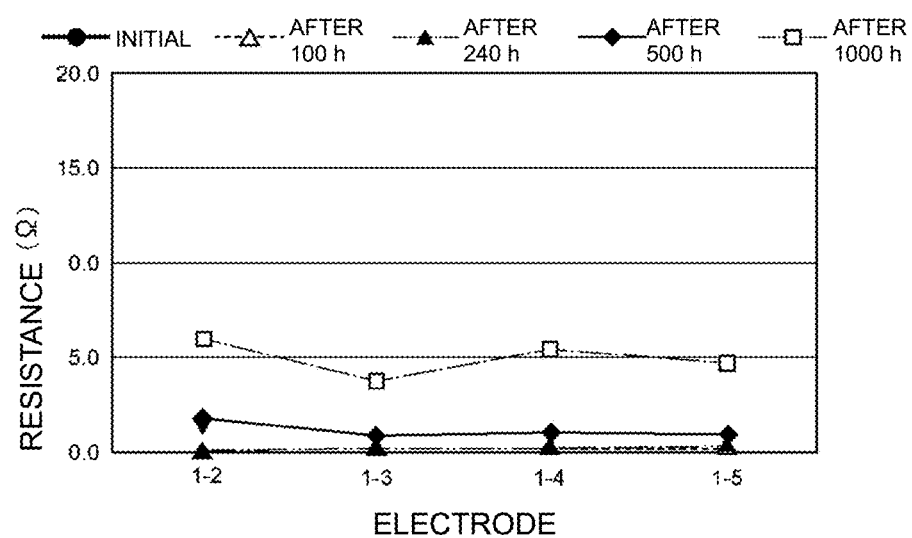
FIG. 20 is a graph showing the results of an evaluation of moisture resistance in the third modified example.
Figure 21:
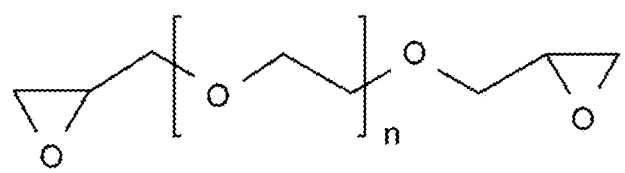
FIG. 21 shows a structural formula of an epoxy compound added in a fourth modified example.
Figure 22:
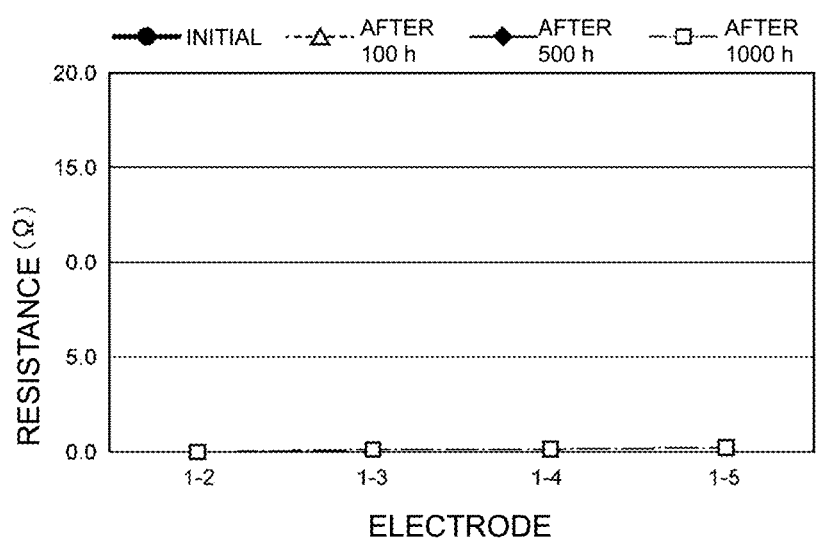
FIG. 22 is a graph showing the results of an evaluation of moisture resistance in the fourth modified example.

22. FIG. 15 shows a structural formula of an epoxy compound added in a first modified example. FIG. 16 is a graph showing the results of an evaluation of moisture resistance in the first modified example. FIG. 17 shows a structural formula of an epoxy compound added in a second modified example. FIG. 18 is a graph showing the results of an evaluation of moisture resistance in the second modified example. FIG. 19 shows a structural formula of an epoxy compound added in a third modified example. FIG. 20 is a graph showing the results of an evaluation of moisture resistance in the third modified example. FIG. 21 shows a structural formula of an epoxy compound added in a fourth modified example. FIG. 22 is a graph showing the results of an evaluation of moisture resistance in the fourth modified example.

In the moisture resistance test for the first to fourth modified examples, changes in resistance in 85° C. and 85% RH were measured and compared in the same manner as the method of evaluation of the example and the comparative example shown in FIG. 4 to FIG. 7. "INITIAL" represents resistance in an initial state before being put into 85° C. and 85% RH, "AFTER 100 h" represents resistance at 100 hours after being put into 85° C. and 85% RH, "AFTER 240 h" represents resistance at 240 hours after being put into 85° C. and 85% RH, "AFTER 500 h" represents resistance at 500 hours after being put into 85° C. and 85% RH, and "AFTER 1000 h" represents resistance at 1000 hours after being put into 85° C. and 85% RH. The resistance in the initial state in each of the first to fourth modified examples was substantially 0 Ω. Therefore, the values of resistance at 100, 240, 500, and 1000 hours each correspond to the amount of resistance change from the initial state. Larger amounts of resistance change indicate lower moisture resistance.

The first to fourth modified examples have the same configuration as that of the present embodiment except that the type of epoxy compound contained in the electrically conductive adhesive is different. The epoxy compound contained in the electrically conductive adhesive of the first modified example is 1,4-butanediol diglycidyl ether shown in FIG. 15. The epoxy compound contained in the electrically conductive adhesive of the second modified example is neopentylglycol diglycidyl ether shown in FIG. 17. The epoxy compound contained in the electrically conductive adhesive of the third modified example is trimethylolpropane triglycidyl ether shown in FIG. 19. The epoxy compound contained in the electrically conductive adhesive of the fourth modified example is polyethylene glycol diglycidyl ether shown in FIG. 21. The epoxy compound content in each of the first to fourth modified examples is 1.0 wt %.

In the case of the first modified example shown in FIG. 16, the resistance showed almost no increase until at 100 hours, had started to increase at 240 hours, and had increased to about 14Ω at maximum at 1000 hours. In the case of the second modified example shown in FIG. 18, the resistance showed almost no increase until at 240 hours, had started to increase at 500 hours, and had increased to about 5 to 6Ω at maximum at 1000 hours. In the case of the third modified example shown in FIG. 20, the resistance showed almost no increase until at 240 hours, had started to increase at 500 hours, and had increased to about 5 to 6Ω at maximum at 1000 hours. In the case of the fourth modified example shown in FIG. 22, the resistance showed almost no increase even at 1000 hours.

In the case of the comparative example shown in FIG. 9, the resistance had started to increase at 100 hours and had exceeded 15Ω at maximum at 1000 hours. In the case of the example shown in FIG. 12, the resistance had remained substantially 0Ω at 1000 hours. That is to say, the start of the increase in resistance in the first to fourth modified examples is slower than in the comparative example. The maximum value of resistance in the first modified example is larger than the maximum value of resistance in the example and smaller than the maximum value of resistance in the comparative example. The maximum values of resistance in the second and third modified examples are larger than the maximum value of resistance in the example and less than half of the maximum value of resistance in the comparative example. The maximum value of resistance in the fourth modified example is comparable to the maximum value of resistance in the example. In other words, the moisture resistance in the first to fourth modified examples, as in the case of the example, is higher than that in the comparative example. The moisture resistance in the first modified example is higher than the moisture resistance in the comparative example. The moisture resistance in the second modified example is substantially comparable to the moisture resistance in the third modified example and higher than the moisture resistance in the first modified example. The moisture resistance in the fourth modified example is substantially comparable to the moisture resistance in the example and higher than the moisture resistance in the second and third modified examples.

The above shows that the epoxy compound that improves the moisture resistance of a cured product of a silicone electrically conductive adhesive is not limited to 1,3-bis(3-glycidoxypropyl)-1,1,3,3-tetramethyldisiloxane and may be any epoxy compound having two or more epoxy groups. In addition, from the fact that the moisture resistance in the example and the fourth modified example is particularly high, it is presumed that the epoxy compound that improves the moisture resistance has features such as being an organosilicon compound that has a siloxane bond and having two epoxy groups that are linked through a long main chain (e.g., nine or more atoms).

As described above, in the quartz crystal resonator unit 1 according to the present embodiment, the electrically conductive holding member 36a that connects the connection electrode 16a and the electrode pad 33a to each other and the electrically conductive holding member 36b that connects the connection electrode 16b and the electrode pad 33b to each other are each a cured product of an electrically conductive adhesive containing a silicone resin as a main component, and the electrically conductive adhesive contains an epoxy compound having two or more epoxy groups.

With this configuration, deterioration of the resistance between a base member and a quartz crystal resonator in a high-humidity environment can be reduced while improving the frequency-temperature characteristics of the quartz crystal resonator. Specifically, increases in the contact resistance between electrically conductive holding members and connection electrodes and the contact resistance between the electrically conductive holding members and electrode pads can be suppressed.

In the quartz crystal resonator unit 1 according to the present embodiment, the outermost surfaces of the electrode pads 33a and 33b contain gold.

If the electrically conductive adhesive contains an epoxy compound having two or more epoxy groups, an increase in the contact resistance between the electrically conductive adhesive and the electrode pads in a high-humidity environment can be suppressed even if gold, which has low adhesion to resin-based adhesives, is contained in the outermost surfaces of the electrode pads. This eliminates the need for surface treatment (e.g., Ag sputtering) on the electrode pads for improving the adhesion to the electrically conductive adhesive, thus preventing a decrease in corrosion resistance of the electrode pads due to the surface treatment. Consequently, a quartz crystal resonator unit having high corrosion resistance and high moisture resistance can be provided.

In the quartz crystal resonator unit 1 according to the present embodiment, the outermost surfaces of the connection electrodes 16a and 16b contain gold.

If the electrically conductive adhesive contains an epoxy compound having two or more epoxy groups, an increase in the contact resistance between the electrically conductive adhesive and the connection electrodes in a high-humidity environment can be suppressed even if gold, which has low adhesion to resin-based adhesives, is contained in the outermost surfaces of the connection electrodes. This eliminates the need for surface treatment (e.g., Ag sputtering) on the connection electrodes for improving the adhesion to the electrically conductive adhesive, thus preventing a decrease in corrosion resistance of the connection electrodes due to the surface treatment. Consequently, a quartz crystal resonator unit having high corrosion resistance and high moisture resistance can be provided.

In the quartz crystal resonator unit 1 according to the present embodiment, the joining member 50 that joins the base member 30 and the lid member 40 to each other to seal the internal space 49 is further included, and the joining member 50 is a cured product of a resin-based adhesive.

When the base member and the lid member are joined with a resin-based adhesive, the quartz crystal resonator unit can be produced at lower cost but has higher moisture permeability than when they are joined with a metal. Even in such a case, deterioration of the resistance between the base member and the quartz crystal resonator in a high-humidity environment can be reduced. Consequently, a quartz crystal resonator unit having high moisture resistance can be provided while reducing the production cost.

In the quartz crystal resonator unit 1 according to the present embodiment, the epoxy compound contained in the electrically conductive adhesive is 1,3-bis(3-glycidoxypropyl)-1,1,3,3-tetramethyldisiloxane, which is an organosilicon compound having a siloxane bond.

In the quartz crystal resonator unit 1 according to the present embodiment, the content of the epoxy compound in the electrically conductive adhesive is preferably 0.5 wt % to 10.0 wt %.

With this configuration, an increase in the resistance of the electrically conductive holding members 36a and 36b in a high-humidity environment can be suppressed while suppressing a decrease in the frequency and temperature dependence of the quartz crystal resonator unit 1.

Embodiments according to the present invention are applicable not only to quartz crystal resonator units but also to piezoelectric resonator units. An example of the piezoelectric resonator units is a quartz crystal resonator unit including a quartz crystal resonator. The quartz crystal resonator uses a quartz crystal element as a piezoelectric element that is excited by the piezoelectric effect. The piezoelectric element may be formed of any piezoelectric material such as a piezoelectric single crystal, a piezoelectric ceramic, a piezoelectric thin film, or a piezoelectric polymer film. One example of the piezoelectric single crystal is lithium niobate ($LiNbO_3$). Similarly, examples of the piezoelectric ceramic include barium titanate ($BaTiO_3$), lead titanate ($PbTiO_3$), lead zirconate titanate ($Pb(Zr_xTi_{1-x})O_3$; PZT), aluminum nitride (AlN), lithium niobate ($LiNbO_3$), lithium metaniobate ($LiNb_2O_6$), bismuth titanate ($Bi_4Ti_3O_{12}$), lithium tantalate ($LiTaO_3$), lithium tetraborate ($Li_2B_4O_7$), langasite ($La_3Ga_5SiO_{14}$), and tantalum pentoxide ($Ta_2O_5$). The piezoelectric thin film may be formed by depositing the piezoelectric ceramic on a substrate made of quartz, sapphire, or the like by, for example, sputtering. Examples of the piezoelectric polymer film include polylactic acid (PLA), polyvinylidene fluoride (PVDF), and vinylidene fluoride/trifluoroethylene (VDF/TrFE) copolymers. The piezoelectric materials given above may be stacked on top of each other or may be stacked on another member.

Embodiments according to the present invention are applicable not only to piezoelectric resonator units but also to any electronic component that includes a first adherend portion having electrical conductivity, a second adherend portion having electrical conductivity, and an electrically conductive adhesive portion that connects the first adherend portion and the second adherend portion to each other, wherein the electrically conductive adhesive portion is a cured product of an electrically conductive adhesive containing a silicone resin as a main component, and the electrically conductive adhesive contains an epoxy compound having two or more epoxy groups. For example, in the case of the quartz crystal resonator unit 1, the first adherend portion corresponds to the connection electrodes 16a and 16b, the second adherend portion corresponds to the electrode pads 33a and 33b, the electrically conductive adhesive portion corresponds to the electrically conductive holding members 36a and 36b, and the electronic component corresponds to the quartz crystal resonator unit 1. In other words, any electronic component containing bonded portions that are bonded to each other with an electrically conductive adhesive portion interposed therebetween and are required to be electrically connected to the electrically conductive adhesive portion can be an embodiment of the present invention without particular limitation. Examples of such electronic components include resonator units other than quartz crystal resonator units, transistors, diodes, capacitors, inductors, resistors, integrated circuits (ICs), image pickup devices, display devices, sensors, and MEMS devices.

For example, when the electronic component is a resonator having a mechanical vibration portion, the electrically conductive adhesive portion is subjected to a vibration load. Thus, when the adhesion between the adherend portions and the electrically conductive adhesive portion is insufficient, the contact resistance at the interfaces between the adherend portions and the electrically conductive adhesive portion increases due to the low adhesion, and in the worst case, separation occurs, thus resulting in loss of the electrical conductivity. Even in the case of such an electronic component having a configuration in which the interfaces between adherend portions and an electrically conductive adhesive portion are subjected to a load due to an impact during transportation, displacement during operation, or the like, an increase in contact resistance in a high-humidity environment can be suppressed according to an embodiment of the present invention.

Hereinafter, the configuration of an electronic device according to another embodiment of the present invention will be described. The following embodiment will be described only by referring to points different from the first embodiment while omitting descriptions of points common to the first embodiment. In particular, similar advantages obtained by similar configurations will not be repeated.

Second Embodiment

Figure 8:
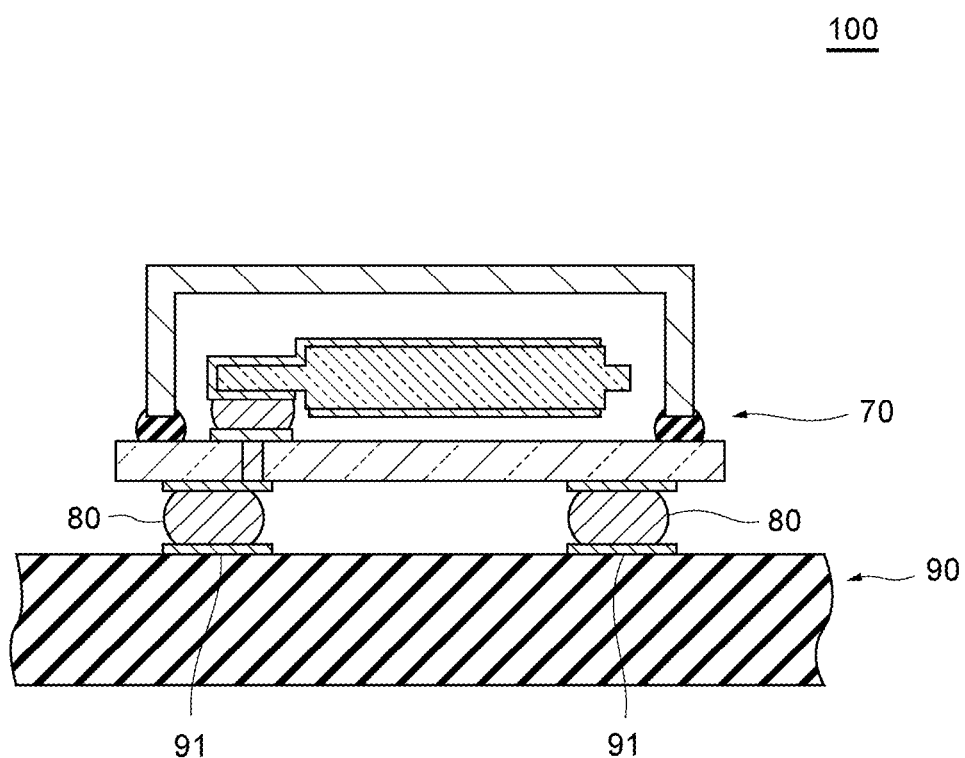
FIG. 8 is a sectional view schematically illustrating the configuration of an electronic device according to a second embodiment.

The configuration of an electronic device 100 according to a second embodiment will be described with reference to FIG. 8. FIG. 8 is a sectional view schematically illustrating the configuration of the electronic device according to the second embodiment.

The electronic device 100 according to the second embodiment includes an electronic component 70, a substrate 90 including a metal layer 91, and an electrically conductive adhesive portion 80 that connects the electronic component 70 and the metal layer 91 of the substrate 90 to each other. The electrically conductive adhesive portion 80 is a cured product of an electrically conductive adhesive containing a silicone resin as a main component, and the electrically conductive adhesive contains an epoxy compound having two or more epoxy groups. In FIG. 8, for example, a quartz crystal resonator unit is depicted as the electronic component 70. However, the electronic component 70 is not limited to the quartz crystal resonator unit and may be, for example, a resonator unit other than the quartz crystal resonator unit, a transistor, a diode, a capacitor, an inductor, a resistor, an integrated circuit (IC), an image pickup device, a display device, a sensor, a MEMS device.

The electrically conductive adhesive portion that is a cured product of an electrically conductive adhesive containing a silicone resin as a main component, the electrically conductive adhesive containing an epoxy compound having two or more epoxy groups, may be used for electrical connection outside the electronic component as in the second embodiment, or may be used for electrical connection inside the electronic component as in the first embodiment.

Hereinafter, some or all of the embodiments of the present invention will be additionally described, and the advantages thereof will be described. The present invention is not limited to the following additional descriptions.

One aspect of the present invention provides a quartz crystal resonator unit including: a quartz crystal resonator including an excitation electrode and a connection electrode electrically connected to the excitation electrode; a base member including an electrode pad; an electrically conductive holding member that connects the connection electrode and the electrode pad to each other; and a lid member attached to the base member so as to form an internal space between the lid member and the base member in which the quartz crystal resonator is accommodated. The electrically conductive holding member is a cured product of an electrically conductive adhesive containing (1) a silicone resin as a main component and (2) an epoxy compound having two or more epoxy groups.

With this configuration, deterioration of the resistance between the base member and the quartz crystal resonator in a high-humidity environment can be reduced while improving the frequency-temperature characteristics of the quartz crystal resonator. Specifically, increases in the contact resistance between the electrically conductive holding member and the connection electrode and the contact resistance between the electrically conductive holding member and the electrode pad can be suppressed. That is, a quartz crystal resonator unit having high moisture resistance can be provided.

In one aspect, the epoxy groups are each a part of a glycidyl group.

If the epoxy groups of the epoxy compound contained in the electrically conductive adhesive are each a part of a glycidyl group, a quartz crystal resonator unit having particularly high moisture resistance can be provided.

In one aspect, the outermost surface of the electrode pad contains gold.

If the electrically conductive adhesive contains an epoxy compound having two or more epoxy groups, an increase in the contact resistance between the electrically conductive adhesive and the electrode pad in a high-humidity environment can be suppressed even if gold, which has low adhesion to resin-based adhesives, is contained in the outermost surface of the electrode pad. This eliminates the need for surface treatment (e.g., Ag sputtering) on the electrode pad for improving the adhesion to the electrically conductive adhesive, thus preventing a decrease in corrosion resistance of the electrode pad due to the surface treatment. Consequently, a quartz crystal resonator unit having high corrosion resistance and high moisture resistance can be provided.

In one aspect, the outermost surface of the connection electrode contains gold.

If the electrically conductive adhesive contains an epoxy compound having two or more epoxy groups, an increase in the contact resistance between the electrically conductive adhesive and the connection electrode in a high-humidity environment can be suppressed even if gold, which has low adhesion to resin-based adhesives, is contained in the outermost surface of the connection electrode. This eliminates the need for surface treatment (e.g., Ag sputtering) on the connection electrode for improving the adhesion to the electrically conductive adhesive, thus preventing a decrease in corrosion resistance of the connection electrode due to the surface treatment. Consequently, a quartz crystal resonator unit having high corrosion resistance and high moisture resistance can be provided.

In one aspect, a joining member that joins the base member and the lid member to each other to seal the internal space is further included, and the joining member is a resin-based adhesive.

When the base member and the lid member are joined with a resin-based adhesive, the quartz crystal resonator unit can be produced at lower cost but has higher moisture permeability than when they are joined with a metal. Even in such a case, deterioration of the resistance between the base member and the quartz crystal resonator in a high-humidity environment can be reduced. Consequently, a quartz crystal resonator unit having high moisture resistance can be provided while reducing the production cost.

In one aspect, the epoxy compound is an organosilicon compound.

In one aspect, the epoxy compound has a siloxane bond.

In one aspect, the epoxy compound is 1,3-bis(3-glycidoxypropyl)-1,1,3,3-tetramethyldisiloxane or includes 1,3-bis(3-glycidoxypropyl)-1,1,3,3-tetramethyldisiloxane as a structural unit.

In the quartz crystal resonator unit 1 according to the present embodiment, a content of the epoxy compound in the electrically conductive adhesive is 0.5 wt % to 10.0 wt %.

With this configuration, an increase in the resistance of the electrically conductive holding members in a high-humidity environment can be suppressed while suppressing a decrease in the frequency and temperature dependence of the quartz crystal resonator unit.

Another aspect of the present invention provides an electronic device including an electronic component, a substrate including a metal layer, and an electrically conductive adhesive portion that connects the electronic component and the metal layer of the substrate to each other. The electrically conductive adhesive portion is a cured product of an electrically conductive adhesive containing a silicone resin as a main component, and the electrically conductive adhesive contains an epoxy compound having two or more epoxy groups.

With this configuration, deterioration of the resistance between the electronic component and the substrate in a high-humidity environment can be reduced. That is, an electronic device having high moisture resistance can be provided.

Another aspect of the present invention provides an electronic component including a first adherend portion having electrical conductivity, a second adherend portion having electrical conductivity, and an electrically conductive adhesive portion that connects the first adherend portion and the second adherend portion to each other. The electrically conductive adhesive portion is a cured product of an electrically conductive adhesive containing (1) a silicone resin as a main component and (2) an epoxy compound having two or more epoxy groups.

With this configuration, deterioration of the resistance between the first adherend portion and the second adherend portion in a high-humidity environment can be reduced. That is, an electronic device having high moisture resistance can be provided.

In one aspect, the first adherend portion is a connection electrode provided in or on a resonator having a mechanical vibration portion.

Even in the case of an electronic component, such as an electronic element, having a configuration in which the interfaces between adherend portions and an electrically conductive adhesive portion are subjected to a load due to an impact during transportation, displacement during operation, or the like, an increase in contact resistance in a high-humidity environment can be suppressed according to an embodiment of the present invention.

As described above, the aspects of the present invention can provide a quartz crystal resonator unit with improved reliability, an electronic component, and an electronic device.

The embodiments described above are presented for a better understanding of the present invention and should not be construed as limiting the present invention. The present invention can be modified or improved without departing from the gist of the invention, and equivalents to the present invention are also included in the present invention. That is, appropriate design modifications made to the embodiments by those skilled in the art are also within the scope of the present invention as long as the modifications have the features of the present invention. For example, the elements included in the embodiments and the arrangements, materials, conditions, shapes, sizes, and the like of the elements are not limited to those exemplified in the embodiments and can be appropriately changed. For example, the resonator and the resonator unit of the present invention can be used as a timing device or a load sensor. The elements included in the embodiments can be combined with each other as long as it is technically possible, and such combinations are also within the scope of the present invention as long as the combinations have the features of the present invention.

REFERENCE SIGNS LIST

1 quartz crystal resonator unit
10 quartz crystal resonator
11 quartz crystal element
14*a*, 14*b* excitation electrode
15*a*, 15*b* extended electrode
16*a*, 16*b* connection electrode
30 base member
31 substrate
33*a*, 33*b* electrode pad
34*a*, 34*b* through electrode
35*a* to 35*d* outer electrode
36*a*, 36*b* electrically conductive holding member
40 lid member
50 joining member

The invention claimed is:

1. A quartz crystal resonator unit comprising:
   a quartz crystal resonator including an excitation electrode and a connection electrode electrically connected to the excitation electrode;
   a base member including an electrode pad;
   an electrically conductive holding member that connects the connection electrode and the electrode pad to each other; and
   a lid member attached to the base member so as to form an internal space between the lid member and the base member in which the quartz crystal resonator is accommodated,
   wherein the electrically conductive holding member is a cured product of an electrically conductive adhesive containing (1) a silicone resin as a main component and (2) an epoxy compound having two or more epoxy groups.

2. The quartz crystal resonator unit according to claim 1, wherein the two or more epoxy groups are each a part of a glycidyl group.

3. The quartz crystal resonator unit according to claim 1, wherein an outermost surface of the electrode pad contains gold.

4. The quartz crystal resonator unit according to claim 1, wherein an outermost surface of the connection electrode contains gold.

5. The quartz crystal resonator unit according to claim 1, further comprising a joining member that joins the base member and the lid member to each other to seal the internal space, wherein the joining member is a cured product of a resin-based adhesive.

6. The quartz crystal resonator unit according to claim 1, wherein the epoxy compound is an organosilicon compound.

7. The quartz crystal resonator unit according to claim 1, wherein the epoxy compound has a siloxane bond.

8. The quartz crystal resonator unit according to claim 1, wherein the epoxy compound is 1,3-bis(3-glycidoxypropyl)-1,1,3,3-tetramethyldisiloxane or includes 1,3-bis(3-glycidoxypropyl)-1,1,3,3-tetramethyldisiloxane as a structural unit.

9. The quartz crystal resonator unit according to claim 1, wherein the electrically conductive adhesive contains 0.5 wt % to 10.0 wt % of the epoxy compound.

10. The quartz crystal resonator unit according to claim 1, wherein the electrically conductive adhesive contains 0.1 wt % to 10.0 wt % of the epoxy compound.

11. An electronic device comprising:
    an electronic component;
    a substrate including a metal layer; and
    an electrically conductive adhesive portion that connects the electronic component and the metal layer of the substrate to each other,
    wherein the electrically conductive adhesive portion is a cured product of an electrically conductive adhesive containing (1) a silicone resin as a main component and (2) an epoxy compound having two or more epoxy groups.

12. The electronic device according to claim 11, wherein the two or more epoxy groups are each a part of a glycidyl group.

13. The electronic device according to claim 11, wherein the epoxy compound is an organosilicon compound.

14. The electronic device according to claim 11, wherein the epoxy compound has a siloxane bond.

15. The electronic device according to claim 11, wherein the epoxy compound is 1,3-bis(3-glycidoxypropyl)-1,1,3,3-tetramethyldisiloxane or includes 1,3-bis(3-glycidoxypropyl)-1,1,3,3-tetramethyldisiloxane as a structural unit.

16. The electronic device according to claim 11, wherein the electrically conductive adhesive contains 0.5 wt % to 10.0 wt % of the epoxy compound.

17. An electronic component comprising:
 a first adherend portion having electrical conductivity;
 a second adherend portion having electrical conductivity; and
 an electrically conductive adhesive portion that connects the first adherend portion and the second adherend portion to each other,
 wherein the electrically conductive adhesive portion is a cured product of an electrically conductive adhesive containing (1) a silicone resin as a main component and (2) an epoxy compound having two or more epoxy groups.

18. The electronic component according to claim 17, wherein the first adherend portion is a connection electrode provided in or on a resonator having a mechanical vibration portion.

19. The electronic component according to claim 17, wherein the two or more epoxy groups are each a part of a glycidyl group.

20. The electronic component according to claim 17, wherein the electrically conductive adhesive contains 0.5 wt % to 10.0 wt % of the epoxy compound.

* * * * *